US008664093B2

United States Patent
Pham et al.

(10) Patent No.: US 8,664,093 B2
(45) Date of Patent: Mar. 4, 2014

(54) METHODS OF FORMING A SILICON SEED LAYER AND LAYERS OF SILICON AND SILICON-CONTAINING MATERIAL THEREFROM

(75) Inventors: Daniel T. Pham, Clifton Park, NY (US); William J. Taylor, Jr., Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 80 days.

(21) Appl. No.: 13/476,552

(22) Filed: May 21, 2012

(65) Prior Publication Data

US 2013/0309846 A1    Nov. 21, 2013

(51) Int. Cl.
*H01L 21/36*     (2006.01)
*H01L 21/20*     (2006.01)
*H01L 21/336*   (2006.01)

(52) U.S. Cl.
USPC ............ 438/478; 438/503; 438/505; 438/507

(58) Field of Classification Search
USPC .................................. 438/478, 503, 505, 507
See application file for complete search history.

(56) References Cited

U.S. PATENT DOCUMENTS

| | | | |
|---|---|---|---|
| 4,097,329 A | 6/1978 | Stock et al. | |
| 5,282,925 A * | 2/1994 | Jeng et al. | 216/59 |
| 5,505,816 A * | 4/1996 | Barnes et al. | 438/695 |
| 6,517,802 B1 | 2/2003 | Xiao et al. | |
| 8,226,840 B2 * | 7/2012 | Sinha | 216/57 |
| 2006/0234418 A1 | 10/2006 | Ufert | |
| 2007/0042507 A1 | 2/2007 | Tsang et al. | |

* cited by examiner

*Primary Examiner* — Luan C Thai
(74) *Attorney, Agent, or Firm* — Amerson Law Firm, PLLC (57) ABSTRACT

Disclosed herein are various methods of forming a silicon seed layer and layers of silicon and silicon-containing material therefrom. In one example, the method includes forming a layer of silicon dioxide above a structure, converting at least a portion of the layer of silicon dioxide into a silicon-salt layer and converting at least a portion of the silicon-salt layer to a layer of silicon.

23 Claims, 9 Drawing Sheets

METHODS OF FORMING A SILICON SEED LAYER AND LAYERS OF SILICON AND SILICON-CONTAINING MATERIAL THEREFROM

BACKGROUND OF THE INVENTION

1. Field of the Invention

Generally, the present disclosure relates to the manufacture of sophisticated semiconductor devices, and, more specifically, to various methods of forming a silicon seed layer and layers of silicon and silicon-containing material therefrom.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Numerous processing operations are performed in a very detailed sequence, or process flow, to form such integrated circuit devices, e.g., deposition processes, etching processes, heating processes, masking operations, etc. In general, the formation of integrated circuit devices involves, among other things, the formation of various layers of material and patterning or removing portions of those layers of material to define a desired structure, such as a gate electrode, a sidewall spacer, etc. To date, the inventors are not aware of any process by which a silicon dioxide material can be converted to silicon at relatively low temperatures.

The present disclosure is directed to various methods of forming a silicon seed layer and layers of silicon and silicon-containing material therefrom.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a silicon seed layer and layers of silicon and silicon-containing material therefrom. In one example, the method includes forming a layer of silicon dioxide above a structure, converting at least a portion of the layer of silicon dioxide into a silicon-salt layer and converting at least a portion of the silicon-salt layer to a layer of silicon.

In another illustrative example, a method is disclosed that includes forming a layer of silicon dioxide above a structure, performing at least one first process operation on the layer of silicon dioxide with a halogen-containing gas to convert at least a portion of the layer of silicon dioxide into a silicon-salt layer, wherein the at least one first process operation is performed at a temperature less than 50° C., and performing at least one second process operation on the silicon-salt layer using a gas comprising hydrogen or hydrogen radicals to convert at least a portion of the silicon-salt layer to a layer of silicon, wherein the at least one second process operation is performed at a temperature less than 50° C.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be, described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a silicon seed layer and layers of silicon and silicon-containing material therefrom. As will be readily apparent to those skilled in the art upon a complete reading of the present application, the methods disclosed herein may be employed in connection with the formation of a variety of integrated circuit products, including, but not limited to, ASICs, logic devices, memory devices, etc. With reference to the attached drawings, various illustrative embodiments of the methods and devices disclosed herein will now be described in more detail.

Figure 1A:
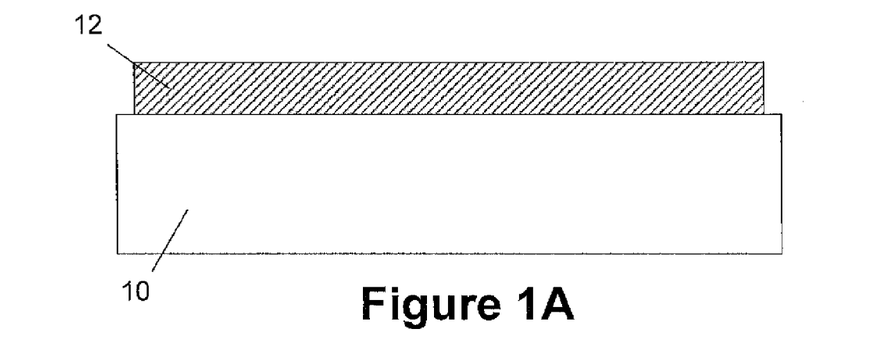
FIGS. 1A-1G depict various illustrative methods disclosed herein for forming layers of silicon and silicon-containing material that may be used in forming various features on integrated circuit devices.

FIGS. 1A-1E depict various illustrative methods disclosed herein for forming layers of silicon and silicon-containing material that may be used in forming various features on integrated circuit devices. As shown in FIG. 1A, a layer of silicon dioxide 12 is formed above a structure 10. The structure 10 is intended to be representative of any type of structure or layer of material that may be employed in manufacturing integrated circuit products. For example, the structure 10 may be a semiconducting substrate, a layer of metal, a layer of silicon nitride, a layer of polysilicon, a layer of gate electrode material, etc. The layer of silicon dioxide 12 may be formed by any technique. For example, the layer of silicon dioxide 12 may be a thermally grown layer of silicon dioxide, a native oxide, a CVD (chemical vapor deposition) based layer of silicon dioxide, am HDP oxide, a flowable silicon dioxide, etc. The thickness of the layer of silicon dioxide 12 may vary depending upon the particular application. In one illustrative embodiment, the layer of silicon dioxide 12 may have a thickness of about 1-50 nm.

Figure 1B:
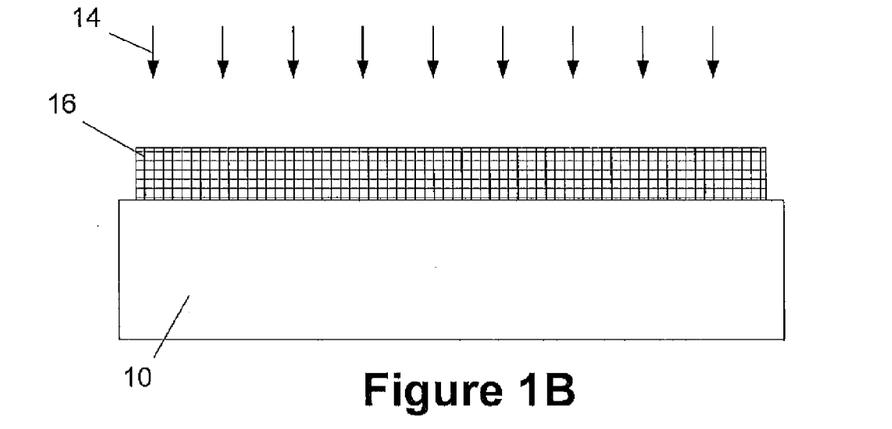

Next, as shown in FIG. 1B, a process operation 14 is performed on the layer of silicon dioxide 12 to convert at least a portion of the layer of silicon dioxide 12 into a silicon-salt layer of material 16. In one illustrative example, the process operation 14 is performed using a halogen-containing gas, such as fluorine, chlorine, bromine, iodine, astatine or combinations thereof. In an even more specific example, the halogen-containing gas is an ammonium hydrogen fluoride gas ($NH_4F.HF$). Other alternatives are ammonium fluorosilicate (($NH_4$)$_2SiF_6$), ammonium fluosilicate, ammonium hexafluorosilicate, ammonium silicofluoride, diammonium fluosilicate, diammonium hexafluorosilicate, etc. For example, the process operation 14 may be performed using a halogen-containing gas such as $NH_3+HF$, $NH_3+NF_3$, vaporized $NH_4F.HF$, etc., and it may be performed at temperatures ranging from about room temperature up to about 50° C. Depending upon the thickness of the layer of silicon dioxide 12 and the duration of the process operation 14, only a portion or the entirety of the layer of silicon dioxide 12 may be converted to a silicon-salt layer 16. In the illustrative example depicted in FIG. 1B, performing the process operation 14 on the layer of silicon dioxide 12 converts the entirety of the layer of silicon dioxide 12 into a silicon-salt layer 16. In one particularly illustrative example, the process operation 14 may comprise the following steps;

$$NF_3(g)+NH_3(g) \rightarrow NH_4F(g)+NH_4F.HF(g) \quad\quad 1)$$

$$NH_4F.HF(g)+SiO_2 \rightarrow (NH_4)_2SiF_6(s)+H_2O(g) \quad\quad 2)$$

In step 1 above, an etchant gas ($NF_3$) is combined with ammonia ($NH_3$) in a plasma based process at a temperature of about 50° C. to form an ammonium fluoride gas ($NH_4F$) and a ammonium hydrogen fluoride gas ($NH_4F.HF$) (trade name ammonium bifluoride or ammonium acid fluoride) In the second step, when the ammonium hydrogen fluoride ($NH_4F.HF$) species contacts the layer of silicon dioxide 12, at least a portion of the layer of silicon dioxide 12 is converted to the silicon-salt layer of material 16 (($NH_4$)$_2SiF_6$) while the oxygen in the converted portion of the layer of silicon dioxide 12 desorbs-away in the form of an $H_2O$ gas. The process described in step 2 may be performed at a temperature of about 20-50° C. or less. The pressure in the process chamber during the process operation 14 will depend upon the plasma generated during the process 14. Typically, the pressure will be a relatively low-pressure process where the pressure may fall within the range of about 500 mTorr-30 Torr. Of course, as will be recognized by those skilled in the art after a complete reading of the present application, the process operation 14 is not limited to the illustrative example depicted above in steps 1 and 2 and, accordingly, the inventions disclosed herein should not be considered so limited.

Figure 1C:
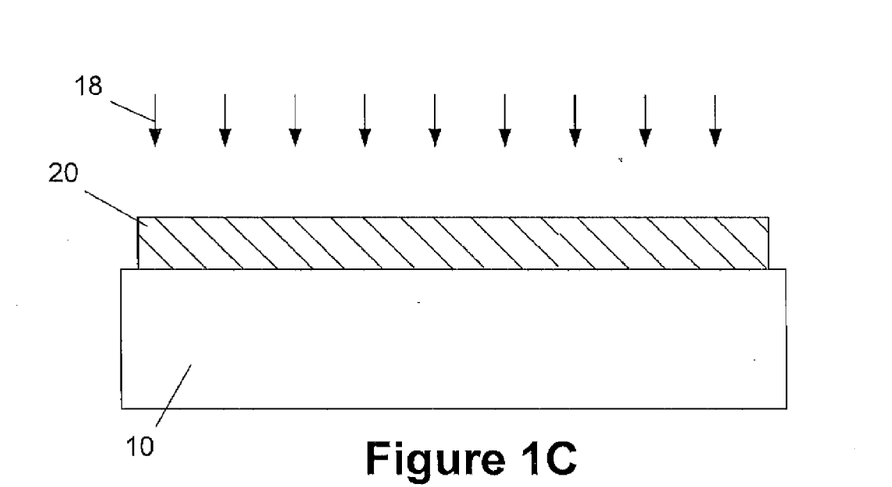

Then, as shown in FIG. 1C, a process operation 18 is performed on the silicon-salt layer of material 16 to convert the silicon-salt layer of material 16 into a silicon layer 20. In one illustrative example, the process operation 18 is performed using a hydrogen-containing gas (with or without N-type or P-type dopants) such as $PH_3$, $BH_3$, $AsH_3$, silane ($SiH_4$), germane ($GeH_4$), etc., or hydrogen radicals that may be formed by exposing hydrogen gas ($H_2$) to an RF plasma. The process operation 18 may be performed at a relatively low temperature, e.g., a temperature from about room temperature up to about 50° C. In one illustrative embodiment, the silicon layer 20 may have a thickness of about 1-50 nm. In one particularly illustrative example, the process operation 18 may comprises the following step:

$$(NH_4)_2SiF_6(s)+4H^+ \rightarrow Si(s)+2NH_3(g)+6HF(g) \quad\quad 3)$$

In step 3, the ammonia ($NH_4$) and the fluorine ($F_6$) in the silicon-salt layer of material 16 (($NH_4$)$_2SiF_6$) combine with the hydrogen radicals (4H+) to form ammonia gas ($2NH_3$) and hydrogen-fluoride gas (6HF) leaving the silicon layer 20. The silicon layer 20 may have a substantially crystalline structure, an amorphous structure, a porous structure or a structure corresponding to a polysilicon material or an amorphous silicon material, etc. If desired, after forming the silicon layer 20, a nitridation process, such as a plasma nitridation process, may be performed on the silicon layer 20 to convert it to silicon nitride. Such conversion processes may be performed at low temperature or room temperature. Of course, as will be recognized by those skilled in the art after a complete reading of the present application, the process operation 18 is not limited to the illustrative example depicted above in step 3 and, accordingly, the inventions disclosed herein should not be considered so limited.

Figure 1D:
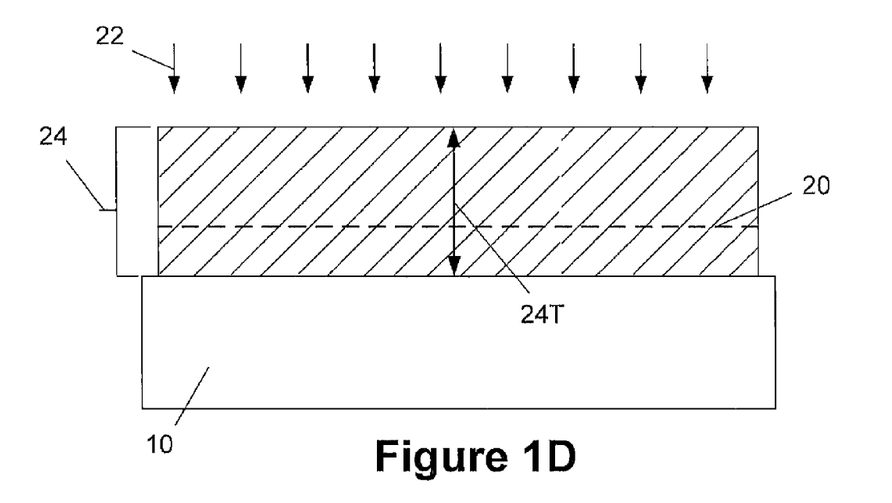

Next, as shown in FIG. 1D, a deposition process 22 is performed to form bulk silicon-containing material 24 using the silicon layer 20 (the original location of the upper surface of the silicon layer 20 is depicted in FIG. 1D with the dashed line) as a seed layer. The bulk silicon-containing material 24 may have a substantially crystalline structure, an amorphous structure, a porous structure or a structure corresponding to a polysilicon material or an amorphous silicon material, etc. Of course, the present invention should not be considered as limited to cases where the bulk silicon-containing material 24 is formed above the silicon layer 20, as the process operation 22 need not be performed to practice at least some aspects of the inventions disclosed herein. In cases where the bulk silicon-containing material 24 is formed, it may have an overall thickness 24T of about 2-100 nm. The formation of the bulk silicon-containing layer 24 is selective in that it will not form except on the silicon layer 20. After the bulk silicon-containing layer 24 is formed, it may be subjected to additional processing operations. For example, metal silicide regions may be formed on the bulk silicon-containing layer 24, source/drain regions may be formed in the bulk silicon-containing layer 24, etc.

Figure 1E:
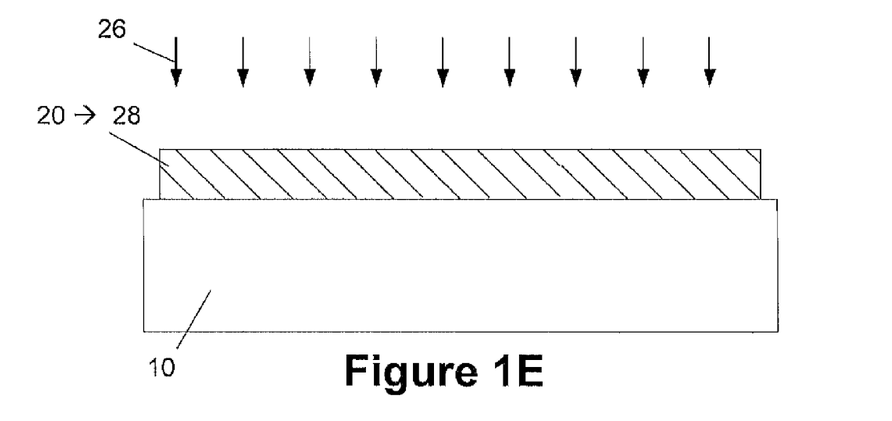

FIG. 1E depicts an illustrative example where a nitrogen-based process operation 26 is performed on the silicon layer 20 to convert at least a portion of the silicon layer 20 into a layer of silicon nitride ($Si_3N_4$) 28. During the nitrogen-based process operation 26, i.e., a nitridation process, nitrogen radicals in the plasma process will react with the silicon in the silicon layer 20 to convert at least portions of the silicon layer 20 into silicon nitride. In the depicted example shown in FIG. 1E, the entirety of the silicon layer 20 was converted to a layer of silicon nitride 28. In one particularly illustrative example, the silicon layer 20 in FIG. 1D may be a layer of porous silicon which may facilitate the formation of the layer of silicon nitride 28. In one illustrative example, the nitridation process operation 26 may be performed at a temperature of about 20-50° C. or less using nitrogen gas.

As will be recognized by those skilled in the art after a complete reading of the present application, the various process operations 14, 18 may be performed in a common process chamber (i.e., an in situ process), or one or more of the process operations 14, 18 may be performed in separate process chambers (i.e., an ex situ process). The deposition or epitaxial process 22 may be performed, in some cases, in a separate process chamber from that used to form the original layer of silicon dioxide or the chamber used to perform the process operations 14, 18. The process operation 26 may also be an in situ or ex situ process operation as compared to deposition process 22.

In one illustrative example, the silicon layer 20 may be doped with any desired dopant material, such as an N-type dopant or a P-type dopant, and the dopant material may be added to the silicon layer 20 during various points of fabricating the silicon layer 20 using a variety of techniques. For example, dopant material may be added to the layer of silicon dioxide 12 as it is being initially formed, an in situ doping process, or it may be added to the layer of silicon dioxide 12 or the silicon layer 20 by way of ion implantation after the layer of silicon dioxide 12 or the silicon layer 20 is formed. In some cases, the ion implantation process may be performed through a patterned mask layer to introduce the desired dopants into select regions of the layer of silicon dioxide 12 or the silicon layer 20.

Figure 1F:
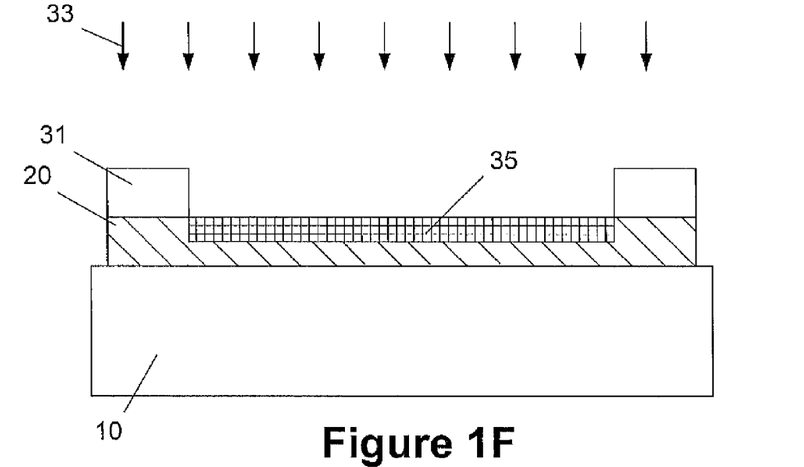
Figure 1G:
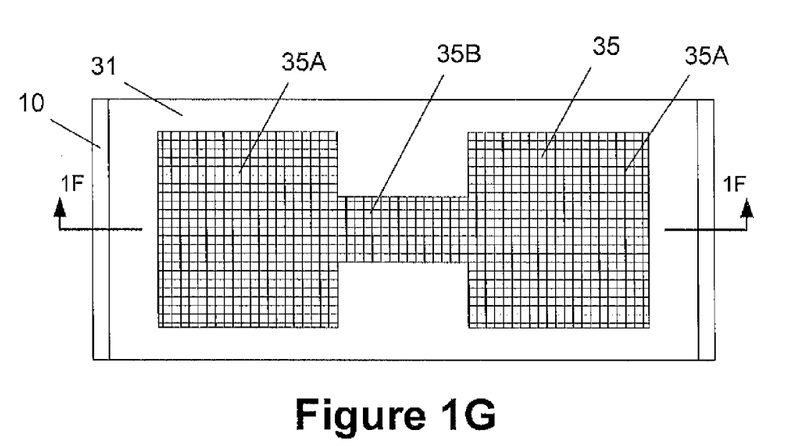

FIGS. 1F-1G depict another illustrative aspect of the presently disclosed subject matter. FIG. 1F (cross-sectional view) and FIG. 1G (plan view) depict an example wherein a patterned mask layer 31, e.g., a photoresist mask, is formed above the silicon layer 20. Thereafter, an ion implantation process 33 is performed through patterned mask layer 31 to defined doped regions 35 in the silicon layer 20. The ion implantation process 33 may be performed using any type of desired dopant material, e.g., an N-type dopant or a P-type dopant material. The depth of the doped regions 35 and the dopant concentration employed in forming the doped regions 35 may vary depending upon the particular application. The pattern defined by the patterned mask layer 31 may be of any desired configuration. In the example depicted in FIG. 1G, the doped region 35 is comprised of two relatively large doped regions 35A that are separated by a smaller connecting region 35B. Using the techniques disclosed herein, selected portions of the silicon layer 20 may be rendered conductive by performing the masked implantation process 33 while leaving other portions of the layer of silicon non-conductive due to the presence of the patterned mask layer 31.

Figure 2A:
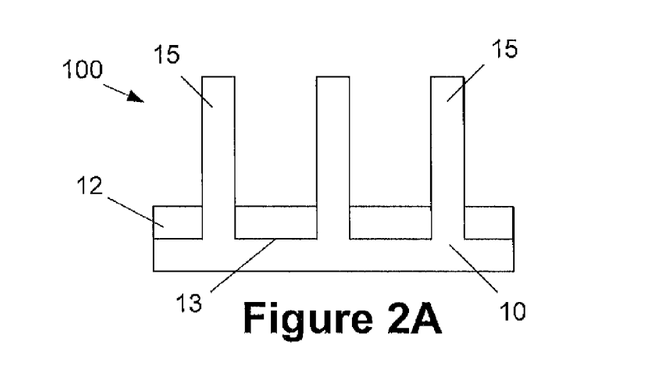
FIGS. 2A-2H depict various illustrative methods disclosed herein for forming layers of silicon and silicon-containing material on illustrative FinFET devices.

FIGS. 2A-2D depict one illustrative example wherein the methods disclosed herein may be employed in connection with formation of an illustrative FinFET transistor device 100. FIG. 2A depicts the FinFET device 100 after several process operations have been performed. Using traditional techniques, one or more etching processes, such as a dry or a wet etching process, have been performed on the substrate 10 through a patterned hard mask layer (not shown) to form a plurality of trenches 13 in the substrate 10. The etching process(es) results in the definition of a plurality of fins 15. The overall size, shape and configuration of the trenches 13 and fins 15 may vary depending on the particular application. The depth and width of the trenches 13 may vary depending upon the particular application. In the depicted example, the trenches 13 and fins 15 are all of a uniform size and shape. However, such uniformity in the size and shape of the trenches 13 and the fins 15 is not required to practice at least some aspects of the inventions disclosed herein. In the example depicted in FIG. 2A, the trenches 13 are formed by performing an anisotropic etching process that results in the trenches 13 having a schematically depicted, generally rectangular configuration. In an actual real-world device, the sidewalls of the trenches 13 may be somewhat inwardly tapered, although that configuration is not depicted in the drawings. Thus, the size and configuration of the trenches 13 and the fins 15, and the manner in which they are made, should not be considered a limitation of the present invention.

Then, as shown in FIG. 2A, in some applications, the layer of silicon dioxide 12 is formed in the trenches 15 by performing several process operations. In one illustrative example, the layer of silicon dioxide 12 may be initially formed by performing a CVD blanket-deposition process to form a layer of silicon dioxide across the device 100 such that it overfills the trenches 13. Thereafter, a chemical mechanical polishing (CMP) process may be performed that stops on the patterned hard mask layer (not shown) or the fins 15. The purpose of the CMP process is to planarize the surface of the layer of silicon dioxide. Then, one or more etching processes are performed on the layer of silicon dioxide to reduce its overall thickness and thereby define the illustrative layer of silicon dioxide 12 depicted in FIG. 2A. The etching process may be either a wet or dry etching process. The final thickness of the layer of silicon dioxide 12 may vary depending on the particular application.

Figure 2B:
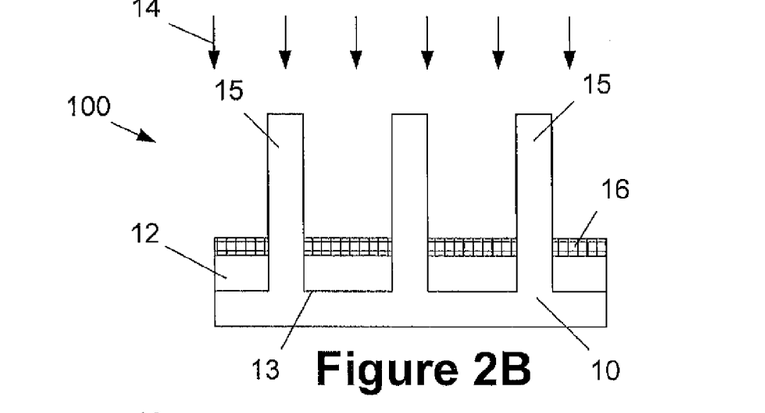
Figure 2C:
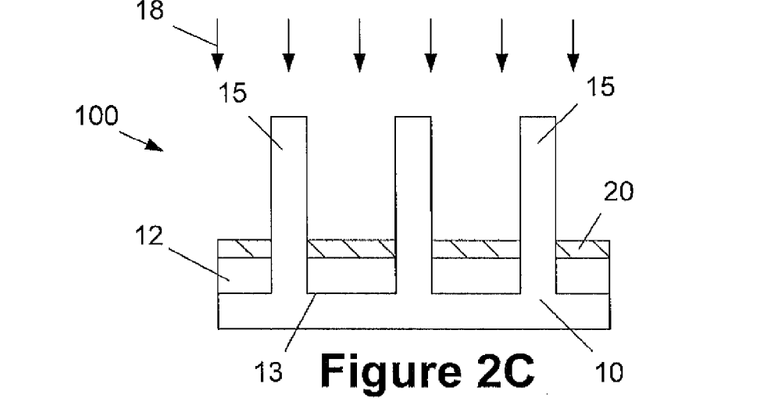
Figure 2D:
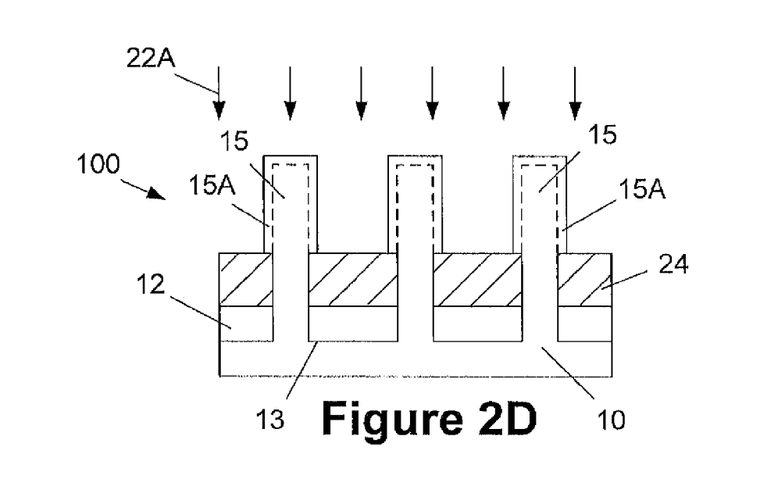

Next, as shown in FIG. 2B, the process operation 14 (described above) is performed on the layer of silicon dioxide 12 to convert at least a portion of the layer of silicon dioxide 12 into the silicon-salt layer of material 16. In this illustrative example, less than the entirety of the layer of silicon dioxide 12 is converted to the silicon-salt layer 16. Then, as shown in FIG. 2C, the process operation 18 (described above) is performed on the silicon-salt layer of material 16 to convert the silicon-salt layer of material 16 into the silicon layer 20. FIG. 2D depicts the FinFET device 100 in the illustrative example where an epitaxial deposition process 22A is performed to form the bulk silicon-containing material 24 using the silicon layer 20 (see FIG. 2C) as seed layer. The epitaxial deposition process 22A also results in the formation of epitaxial semiconductor material 15A on the fins 15. The size and shape of the epitaxial semiconductor material 15A may vary depending upon the particular applications. For reference, the original outline of the fins 15 is depicted with dashed lines in FIG. 2D and in subsequent drawings. In one illustrative embodiment, the epitaxial semiconductor material 15A may have a substantially diamond-shaped configuration. Of course, the inventions disclosed herein should not be considered as limited to any particular shape of the epitaxial semiconductor material 15A. In other applications, the formation of the epitaxial semiconductor material 15A and/or the bulk silicon-containing material 24 may not be required. When present, the epitaxial semiconductor material 15A may have the same or a different crystalline structure as compared to the bulk silicon-containing material 24 depicted in FIG. 2D. That is, for example, the semiconductor material 15A may be a crystalline semiconductor material, while the bulk silicon-containing material 24 may be a polysilicon material or an amorphous silicon material, etc. Traditional process operations may then be performed to complete the formation of the illustrative FinFET device 100.

Figure 2E:
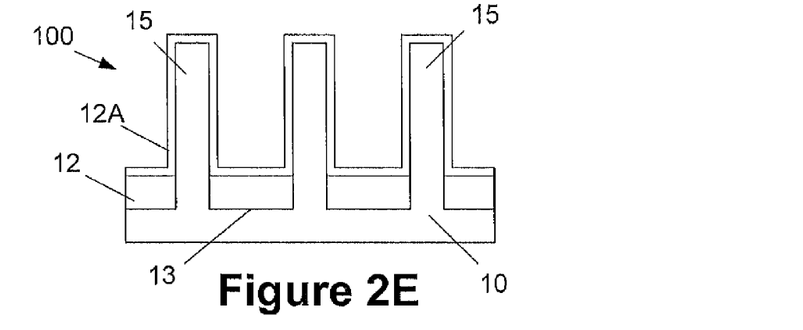
Figure 2F:
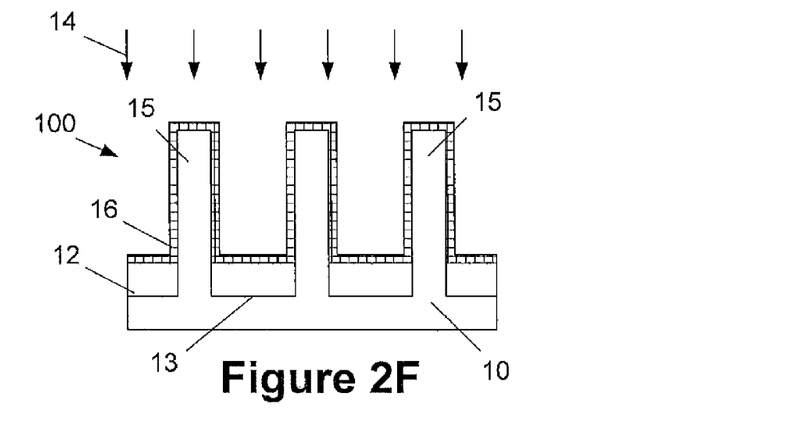
Figure 2G:
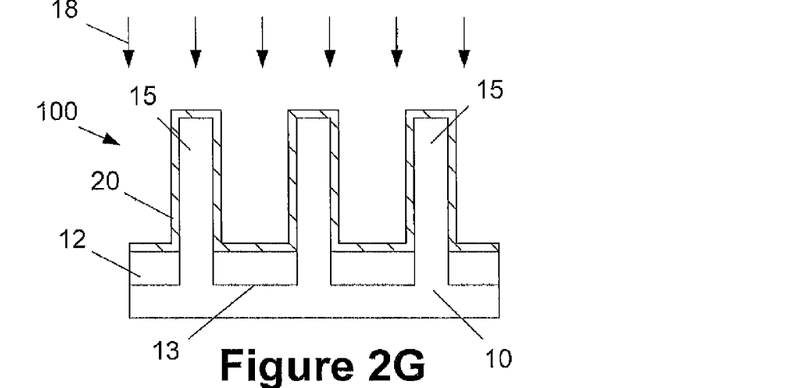
Figure 2H:
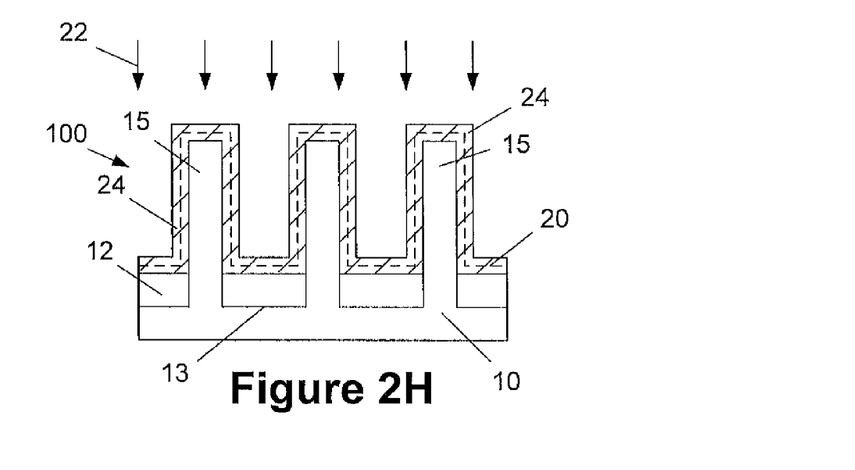

FIG. 2E-2H depict an alternative process flow wherein the methods disclosed herein may be employed in forming an illustrative FinFET device 100. FIG. 2E depicts the device 100 after the illustrative trenches 13, fins 15 and the layer of silicon dioxide 12 have been formed as described above. In this illustrative process flow, a layer of silicon dioxide 12A is conformably deposited across the device 100 and in the trenches 13. The conformably-deposited layer of silicon dioxide 12A shown in FIG. 2E may be formed by performing a CVD or an ALD (atomic layer deposition) process and its thickness may vary from about 1-20 nm. With reference to FIG. 2F, the process operation 14 (described above) is performed on the conformably deposited layer of silicon dioxide 12A to convert at least a portion of the layer of silicon dioxide 12A into the silicon-salt layer of material 16. In this illustrative example, the entirety of the layer of the conformably deposited layer of silicon dioxide 12A is converted to the silicon-salt layer 16. Then, as shown in FIG. 2G, the process operation 18 (described above) is performed on the silicon-salt layer of material 16 to convert the silicon-salt layer of material 16 into the silicon layer 20. FIG. 2H depicts the FinFET device 100 after the deposition process 22 is performed to form the bulk silicon-containing material 24 based on the silicon layer 20 (see FIG. 2G). The deposition process 22 also results in the formation of the bulk silicon-containing material 24 on the fins 15. In this illustrative process flow, the bulk silicon-containing material 24 may have a substantially uniform structure along the fins 15 and at the bottom of the trenches 13, i.e., the entirety of the bulk silicon-containing material may have a polycrystalline structure, an amorphous structure, etc. Traditional process operations may then be performed to complete the formation of the illustrative FinFET device 100.

Figure 3A:
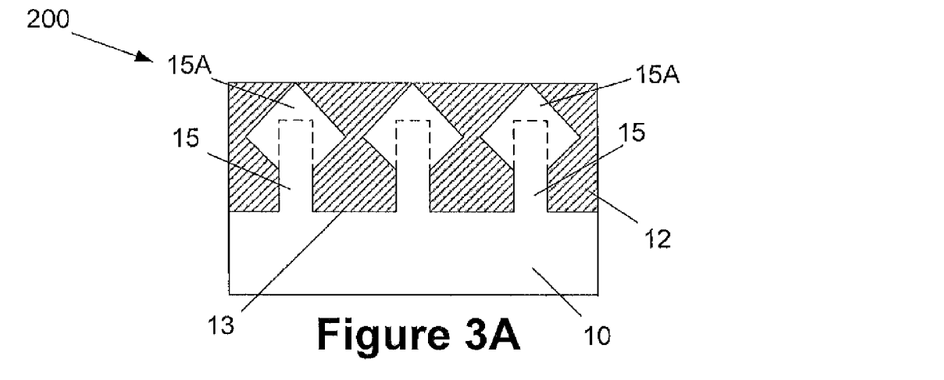
FIGS. 3A-3D depict yet another illustrative method disclosed herein for forming metal silicide regions on an illustrative FinFET device.

FIGS. 3A-3D depict an illustrative process flow wherein the methods disclosed herein may be employed in forming metal silicide regions on an illustrative FinFET device 200. FIG. 3A depicts the device 200 after the illustrative trenches 13 and fins 15 have been formed as described above. FIG. 3A also depicts the device 200 after an epitaxial deposition process has been performed to grow epitaxial semiconductor material 15A on the fins 15. For reference purposes, the original shape of the fins 15 is depicted in dashed lines in FIG. 3A and subsequent drawings. In one illustrative embodiment, the epitaxial semiconductor material 15A may have a substantially diamond-shaped configuration as depicted in the drawings. Of course, the inventions disclosed herein should not be considered as limited to any particular shape of the epitaxial semiconductor material 15A.

With continuing reference to FIG. 3A, the layer of silicon dioxide 12 is formed in the trenches 13. The upper surface of the layer of silicon dioxide 12 may be substantially planarized by over-filling the trenches 13 and performing an etch-back process or by performing a CMP process. In this illustrative example, the layer of silicon dioxide 12 occupies substantially all of the space under the overhanging portions of the epitaxial semiconductor material 15A formed on the fins 15. As noted previously, the layer of silicon dioxide 12 may be any of a variety of different types of silicon dioxide that can be made using a variety of techniques. For example, the layer of silicon dioxide 12 may be a CVD oxide, a flowable oxide material, a spin-on-glass (SOG) material. In general, a spin-on glass material is a solvent-based liquid that is applied to substrates using a spin-coat process that is typically used to form a thin, solid film exhibiting the properties of silicon dioxide after curing. The basic spin-coating process involves depositing a small amount of the liquid on the substrate 10, rotating the substrate 10 at a high rate to evenly distribute the liquid across the substrate 10, allowing the liquid to form a solid film, performing a low temperature (e.g., <250° C.) heating process to partially cure the glass material, and then performing a second heating process at a higher temperature (about 425-450° C.) to fully cure the spin-on glass material. A flowable oxide material may be applied using spin-coating techniques similar to those described above for the spin-on glass material, techniques that are well known to those skilled in the art. For example, the flowable oxide material may be initially applied by performing a spin-coating process at room temperature to spread the material across the substrate 10 and to fill the trenches 13. The flowable oxide material may then be baked for a relatively short duration (about 1 minute) at a temperature of about 150° C. to initially drive off volatile components. Thereafter, the flowable oxide material may be heated to a temperature of about 200° C. to provide additional curing and it may then be heated at about 350° C. to reflow the material.

Figure 3B:
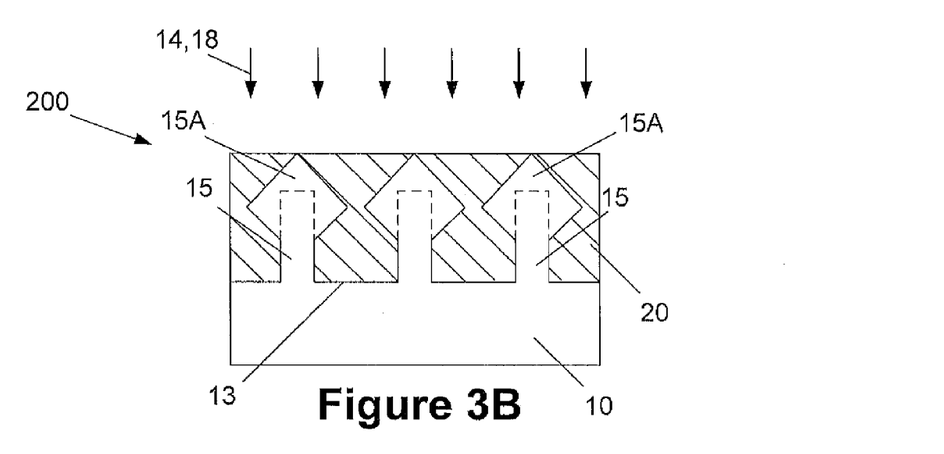

Next, as schematically depicted in FIG. 3B, the process operations 14, 18 (described above) are performed on the layer of silicon dioxide 12 to convert at least a portion of the layer of silicon dioxide 12 to the silicon layer 20. In the example depicted in FIG. 3B, the entirety of the layer of silicon dioxide 12 is converted to silicon, although that may not be the case in all applications. In one illustrative embodiment, the silicon layer 20 may be a porous silicon material.

Figure 3C:
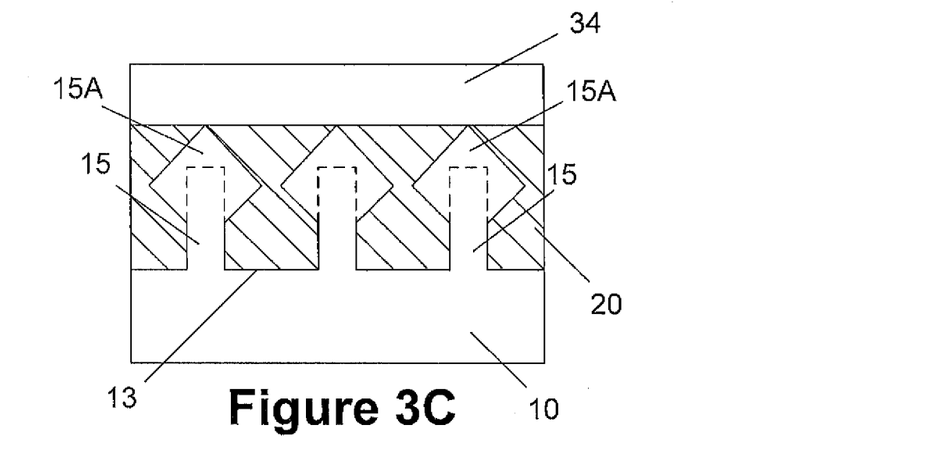
Figure 3D:
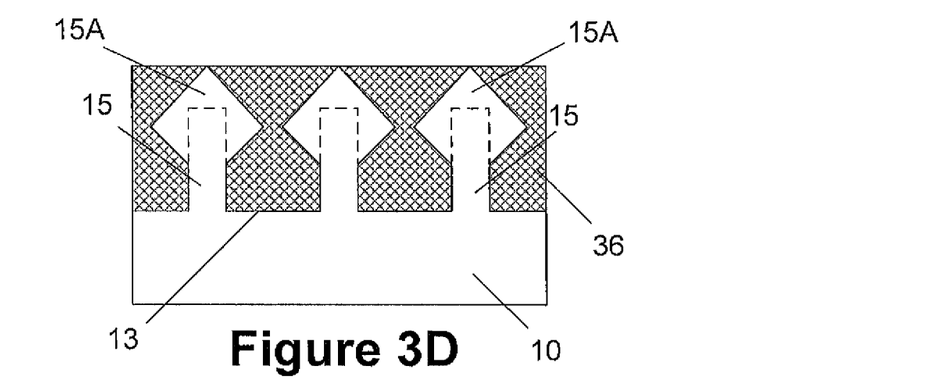

Next, as shown in FIGS. 3C-3D, a silicidation process is performed to covert at least portions of the silicon layer 20 into a metal silicide 36. In the example depicted in FIGS. 3C-3D, the entirety of the layer of silicon layer 20 is converted to metal silicide 36, although that may not be required in all applications. The metal silicide material 36 may be comprised of a variety of different metal silicides such as, for example, nickel silicide, nickel-platinum silicide, cobalt silicide, etc., and the thickness of such metal silicide material 36 may vary depending upon the particular application. The typical silicidation process involves: (1) depositing a layer of refractory metal 34 on the silicon layer 20, as shown in FIG. 3C; (2) performing an initial heating process causing the refractory metal to react with the underlying silicon layer 20; (3) performing an etching process to remove unreacted portions of the layer of refractory metal; and (4) performing an additional heating process to form the final phase of the metal silicide. The details of such silicidation processes are well known to those skilled in the art. For ease of explanation, any silicidation of the epitaxial semiconductor material 15A is not depicted in FIGS. 3C-3D, although silicdation of the epitaxial semiconductor material may likely occur. In one illustrative embodiment, the formation of the metal silicide material 36 around and under the fins 15/15A may be easier where the silicon layer 20 shown in FIG. 3C is a porous silicon material. After formation of the metal silicide material 36, traditional process operations may then be performed to complete the formation of the illustrative FinFET device 200.

Figure 4A:
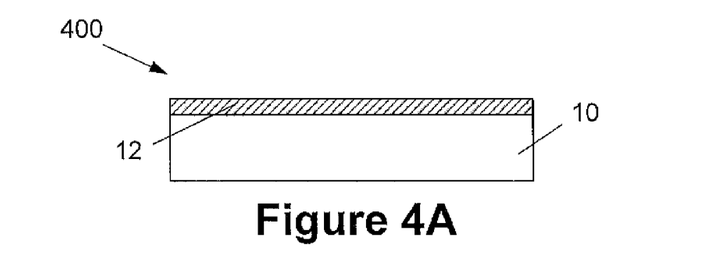
FIGS. 4A-4E depict an illustrative process flow wherein the methods disclosed herein may be employed in forming portions of various forms of memory devices.
Figure 4B:
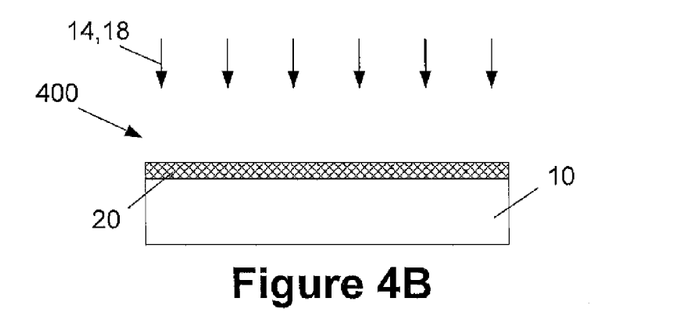
Figure 4C:
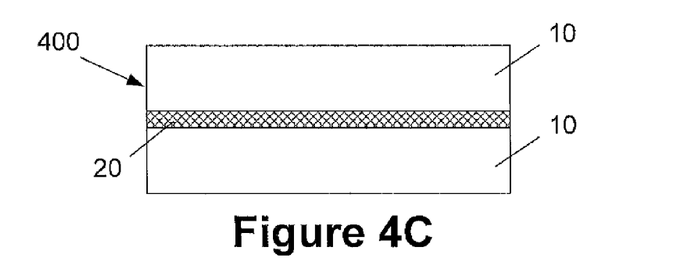
Figure 4D:
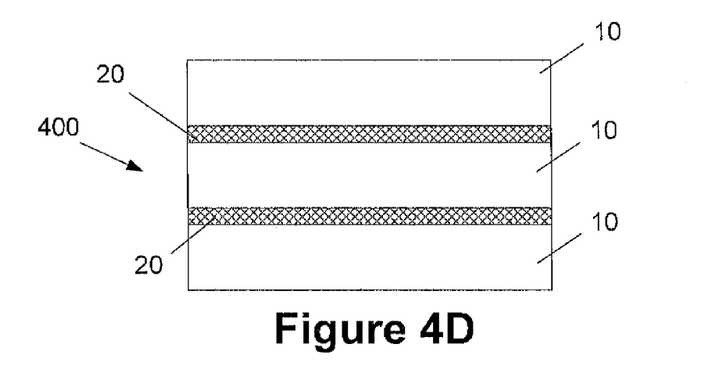

FIGS. 4A-4E depict an illustrative process flow wherein the methods disclosed herein may be employed in various aspects of a variety of different types of memory devices 400. For example, the methods disclosed herein may be employed in forming storage layers, insulating layers and/or conductive layers employed in many different types of memory devices or photonic crystal devices. FIG. 4A depicts the device 400 at the point of fabrication wherein the layer of silicon dioxide 12 is deposited above the structure 10. As noted previously, the structure 10 is intended to be representative in nature of any of a variety of different structures or material layers that are commonly present on integrated circuit products. For example, the structure 10 may be a semiconducting substrate, such as silicon, a layer of silicon nitride, a layer of metal, etc. The layer of silicon dioxide 12 may be formed by any technique. For example, the layer of silicon dioxide 12 may be a thermally grown layer of silicon dioxide, a native oxide, a CVD (chemical vapor deposition) based layer of silicon dioxide, a flowable oxide, an HDP oxide, etc. The thickness of the layer of silicon dioxide 12 may vary depending upon the particular application. In one illustrative embodiment, the layer of silicon dioxide 12 may have a thickness of about 1-50 nm. Next, as shown in FIG. 4B, the process operations 14, 18 (described above) are performed on the layer of silicon dioxide 12 to convert at least a portion of the layer of silicon dioxide 12 to the silicon layer 20. In the example depicted in FIG. 4B, the entirety of the layer of silicon dioxide 12 is converted to silicon, although that may not be the case in all applications. In one illustrative embodiment, the silicon layer 20 may be a porous silicon material. Then, as shown in FIG. 4C, another structure 10 is formed above the layer of porous silicon 20. These processes may all be performed at low temperature or at room temperature. FIG. 4D depicts the device 400 after the aforementioned processes have been repeated to form a second silicon layer 20 and another structure layer 10. These processes may be repeated as many times as desired to form a memory device, wherein the multiple layers of the silicon layer 20 serve as memory material.

Figure 4E:
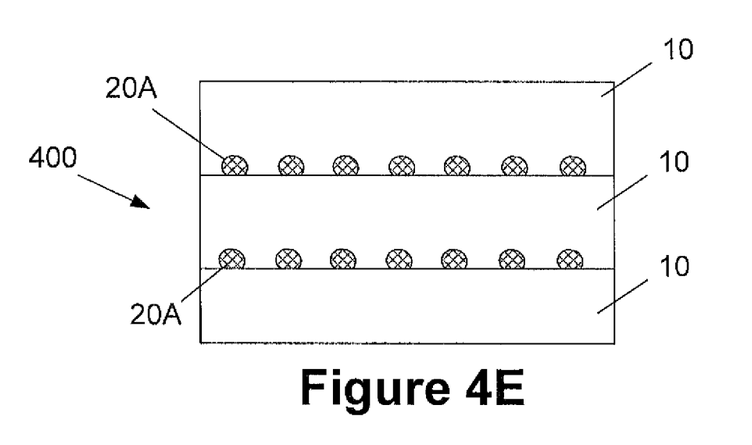

In a further embodiment shown in FIG. 4E, a heating process (at a temperature that is greater than about 900° C.) is performed on the device 400 depicted in FIG. 4D to cause the layers of silicon 20 to essentially agglomerate into silicon ball-like structures 20A due to the surface tension of the silicon material. These silicon ball-like structures 20A may also be doped or undoped as described previously with respect to the layer of silicon dioxide 12. Given that all of the layers of silicon 20 in the device 400 are formed at the same temperature, e.g., room temperature, prior to the heating process, after the heating process is performed, the silicon ball-like structures 20A should be at relatively the same crystallization stage, which results in a more uniform structure from layer to layer. The silicon ball-like structures 20A should have at least similar (if not the same) optical properties. Such a structure may be employed in a variety of applications, such as, for example, photonic crystal applications.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer of silicon dioxide above a structure;
   converting at least a portion of said layer of silicon dioxide into a silicon-salt layer; and
   converting at least a portion of said silicon-salt layer to a layer of silicon.

2. The method of claim 1, further comprising performing a deposition process to form a bulk layer of a silicon-containing material while using said silicon layer as a seed layer.

3. The method of claim 1, further comprising converting at least a portion of said layer of silicon to silicon nitride.

4. The method of claim 1, further comprising introducing a dopant material into at least one of said layer of silicon dioxide or said layer of silicon to thereby form at least one of a doped layer of silicon dioxide or a doped layer of silicon.

5. The method of claim 4, wherein said dopant material is introduced into said at least one of said layer of silicon dioxide or said layer of silicon by performing one of an in situ doping process or an ion implantation process.

6. The method of claim 1, wherein forming said layer of silicon dioxide comprises performing at least one of a thermal growth process, a chemical vapor deposition process, a spin coating process and a thermal curing process.

7. The method of claim 1, wherein said layer of silicon dioxide is one of a thermally grown layer of silicon dioxide, a flowable oxide, a native oxide and a spin-on glass material.

8. The method of claim 1, wherein converting at least a portion of said layer of silicon dioxide into said silicon-salt layer comprises performing a process operation on said layer of silicon dioxide with a halogen-containing gas.

9. The method of claim 7, wherein said process operation is performed at a temperature less than 50° C.

10. The method of claim 7, wherein said halogen-containing gas is ammonium hydrogen fluoride gas ($NH_4F \cdot HF$).

11. The method of claim 1, wherein converting at least a portion of said silicon-salt layer to said layer of silicon comprises performing a process operation on said silicon-salt layer using a gas comprised of hydrogen or hydrogen radicals.

12. The method of claim 11, wherein said process operation is performed at a temperature less than 50° C.

13. The method of claim 1, wherein converting at least a portion of said layer of silicon dioxide into said silicon-salt layer comprises performing the following process operation on said layer of silicon dioxide:

$$NF_3(g) + NH_3(g) \rightarrow NH_4F(g) + NH_4F \cdot HF(g) \qquad 1)$$

$$NH_4F \cdot HF(g) + SiO_2 \rightarrow (NH_4)_2SiF_6(s) + H_2O(g). \qquad 2)$$

14. The method of claim 13, wherein converting at least a portion of said silicon-salt layer to said layer of silicon comprises performing the following process operation on said silicon-salt layer:

$$(NH_4)_2SiF_6(s) + 4H^+ \rightarrow Si(s) + 2NH_3(g) + 6HF(g).$$

15. The method of claim 1, further comprising:
   forming a patterned mask layer above said layer of silicon; and
   performing an ion implantation process through said patterned mask layer to form a doped region in said layer of silicon.

16. A method, comprising:
   forming a layer of silicon dioxide above a structure;

performing at least one first process operation on said layer of silicon dioxide with a halogen-containing gas to convert at least a portion of said layer of silicon dioxide into a silicon-salt layer, wherein said at least one first process operation is performed at a temperature less than 50° C.; and performing at least one second process operation on said silicon-salt layer using a gas comprising hydrogen or hydrogen radicals to convert at least a portion of said silicon-salt layer to a layer of silicon, wherein said at least one second process operation is performed at a temperature less than 50° C.

17. The method of claim 16, further comprising performing a deposition process to form a bulk layer of a silicon-containing material while using said silicon layer as a seed layer.

18. The method of claim 16, further comprising converting at least a portion of said layer of silicon to silicon nitride.

19. The method of claim 16, further comprising introducing a dopant material into at least one of said layer of silicon dioxide or said layer of silicon to thereby form at least one of a doped layer of silicon dioxide or a doped layer of silicon.

20. The method of claim 16, wherein said halogen-containing gas is ammonium hydrogen fluoride gas ($NH_4F.HF$).

21. The method of claim 16, wherein performing said at least one first process operation comprises performing at least the following process operations on said layer of silicon dioxide:

$$NF_3(g) + NH_3(g) \rightarrow NH_4F(g) + NH_4F.HF(g) \quad 1)$$

$$NH_4F.HF(g) + SiO_2 \rightarrow (NH_4)_2SiF_6(s) + H_2O(g). \quad 2)$$

22. The method of claim 21, wherein performing said at least one second process operation on said silicon-salt layer comprises performing at least the following process operation on said silicon-salt layer:

$$(NH_4)_2SiF_6(s) + 4H^+ \rightarrow Si(s) + 2NH_3(g) + 6HF(g).$$

23. The method of claim 16, further comprising:
forming a patterned mask layer above said layer of silicon; and
performing an ion implantation process through said patterned mask layer to form a doped region in said layer of silicon.

* * * * *